United States Patent
Chou

(10) Patent No.: US 6,652,726 B1
(45) Date of Patent: Nov. 25, 2003

(54) METHOD FOR REDUCING WAFER EDGE DEFECTS IN AN ELECTRODEPOSITION PROCESS

(75) Inventor: Shih-Wei Chou, Taipei (TW)

(73) Assignee: Taiwan Semiconductor Manufacturing Co. Ltd., Hsin Chu (TW)

(*) Notice: Subject to any disclaimer, the term of this patent is extended or adjusted under 35 U.S.C. 154(b) by 0 days.

(21) Appl. No.: 10/147,759

(22) Filed: May 16, 2002

(51) Int. Cl.$^7$ .................................................. C25D 5/00
(52) U.S. Cl. ............................ 205/80; 205/87; 205/143; 205/200; 205/221
(58) Field of Search .......................... 205/143, 87, 118, 205/123, 136, 134, 133, 220, 80, 221; 204/224 R

(56) References Cited

U.S. PATENT DOCUMENTS

| | | | |
|---|---|---|---|
| 5,960,555 A | * 10/1999 | Deaton et al. | 34/58 |
| 6,290,865 B1 | * 9/2001 | Lloyd et al. | 216/92 |
| 6,471,847 B2 | * 10/2002 | Talieh et al. | 205/147 |
| 6,482,307 B2 | * 11/2002 | Ashjaee et al. | 205/103 |
| 2002/0108851 A1 | * 8/2002 | Woodruff et al. | 204/242 |

* cited by examiner

Primary Examiner—Roy King
Assistant Examiner—Wesley A. Nicolas
(74) Attorney, Agent, or Firm—Tung & Associates

(57) ABSTRACT

A method for reducing or avoiding semiconductor wafer peripheral defects and contamination during and following electrodeposition including providing a wafer chuck assembly sealably attached to a back side of a semiconductor wafer leaving an exposed peripheral portion of the back side of the semiconductor wafer the backside parallel to a front side of the semiconductor wafer comprising a process surface; contacting at least the semiconductor process surface with a process solution; and, simultaneously directing a pressurized flow of gas onto the exposed peripheral portion such that the pressurized flow of gas covers the exposed peripheral portion including being radially directed outward toward the periphery of the semiconductor wafer.

20 Claims, 2 Drawing Sheets

METHOD FOR REDUCING WAFER EDGE DEFECTS IN AN ELECTRODEPOSITION PROCESS

FIELD OF THE INVENTION

This invention generally relates to metallic electrodeposition on semiconductor surfaces and associated processes and more particularly to a method for reducing wafer edge defects during and following an electrodeposition process.

BACKGROUND OF THE INVENTION

Sub-micron multi-level metallization is one of the key technologies for the next generation of ultra large scale integration (ULSI). The multilevel interconnects that lie at the heart of this technology require planarization of interconnect features formed in high aspect ratio apertures, including contacts, vias, metal interconnect lines and other features. Reliable formation of these interconnect features is very important to the success of ULSI and to the continued effort to increase circuit density and quality on individual substrates and die.

Copper and copper alloys have become the metal of choice for filling sub-micron, high aspect ratio interconnect features on semiconductor substrates. Copper and its alloys have lower resistivity and higher electromigration resistance compared to other metals such as, for example, aluminum. These characteristics are critical for achieving higher current densities increased device speed.

As circuit densities increase, the widths of vias, contacts, metal interconnect lines, and other features, decrease to sub-micron dimensions, whereas the thickness of the dielectric layers, through the use low-k (low dielectric constant) materials, has remained substantially constant. Consequently, the aspect ratios for the features, i.e., their height divided by width, has increased thereby creating additional challenges in adequately filling the sub-micron features with, for example, copper metal. Many traditional deposition processes such as chemical vapor deposition (CVD) have difficulty filling increasingly high aspect ratio features, for example, where the aspect ratio exceeds 2:1, and particularly where it exceeds 4:1.

As a result of these process limitations, electroplating or electrodeposition, which has previously been limited to the fabrication of patterns on circuit boards, is now emerging as a preferable method for filling metal interconnects structures such as via openings (holes) and trench line openings on semiconductor devices. Typically, electroplating uses an electrolyte including positively charged ions of deposition material, for example metal ions, in contact with a negatively charged substrate (cathode) having a source of electrons to deposit (plate out) the metal ions onto the charged substrate, for example, a semiconductor wafer. A thin metal layer (seed layer) is first deposited on the semiconductor wafer to form a liner in high aspect ratio anisotropically etched features to provide a continuous electrical path across the surfaces. An electrical current is supplied to the seed layer whereby the semiconductor wafer surface including etched features are electroplated with an appropriate metal, for example, aluminum or copper, to fill the features.

One exemplary process for forming a series of interconnected multiple layers, for example, is a damascene or dual damascene process. Although there are several different manufacturing methods for manufacturing damascene structures, all such methods employ a series of photolithographic masking and anisotropic etching steps, typically by a reactive ion etch (RIE). In the typical multilayer semiconductor manufacturing process, for example, a series insulating layers are deposited to include a series of interconnecting metallization structures such as vias and metal line interconnects to electrically interconnect areas within the multilayer device and contact layers to interconnect the various devices on the chip surface. In most devices, pluralities of vias are separated from one another along the semiconductor wafer and selectively interconnect conductive regions between layers of a multilayer device. Metal interconnect lines typically serve to selectively interconnect conductive regions within a layer of a multilayer device. Vias and metal interconnect lines are selectively interconnected in order to form the necessary electrical connections.

In filling the via openings and trench line openings with metal, for example, copper, electroplating is a preferable method to achieve superior step coverage of sub-micron etched features. The method generally includes first depositing a barrier layer over the etched opening surfaces, such as via openings and trench line openings, depositing a metal seed layer, for example copper, over the barrier layer, and then electroplating a metal, for example copper, over the seed layer to fill the etched features to form conductive vias and trench lines. Finally, the electro deposited layer and the dielectric layers are planarized, for example, by chemical mechanical polishing (CMP), to define a conductive interconnect feature.

Metal electroplating (electrodeposition) in general is a well-known art and can be achieved by a variety of techniques. Common designs of cells for electroplating a metal on semiconductor wafers involve positioning the plating surface of the semiconductor wafer within an electrolyte solution including an anode with the electrolyte impinging perpendicularly on the plating surface. The plating surface is contacted with an electrical power source forming the cathode of the plating system such that ions in the plating solution deposit on the conductive portion of the plating surface, for example a semiconductor wafer surface.

For example, referring to FIG. 1 is shown a portion of a semiconductor process surface showing a cross sectional side view of a dual damascene structure 10 made up of a via portion 10A and an overlying trench line portion 10B. The dual damascene structure 10 is formed in an insulating layer 12 having, for example, a barrier layer 14A of TaN nitride conformally deposited to over the via and trench sidewalls and via bottom portion and an overlying conformally deposited seed layer 14B, for example, copper typically deposited by physical vapor deposition (PVD) or chemical vapor deposition (CVD). During a typical electroplating process a major portion of the damascene structure 10 is filled with, for example, copper to form copper layer 18 by a high current electrodeposition process. Following the electrodeposition process, a chemical mechanical polishing (CMP) process is carried out to polish back the excess copper layer 18 to achieve a planarized surface.

More recent electroplating processes use self contained assemblies where the anode and semiconductor wafer are in close proximity to carry out both electroplating and electropolishing. Typically the semiconductor wafer surface is spaced apart from the anode in the electroplating solution during electrodeposition and contacts the anode during the electropolishing process where the semiconductor wafer becomes the anode and the anode assembly acts as a cathode. Following the electrodeposition process and electropolishing process, the semiconductor wafer surface is rinsed and dried. During the various processes the semiconductor wafer is attached to a wafer chuck for holding the wafer during the various processes. According to the prior art, a sealing means, typically sealing ring applied around the periphery of the wafer electrodeposition surface has been used to prevent process solutions, including the electrolyte to migrate around the wafer edge and contaminate the backside of the process wafer.

One problem with the prior art electrodeposition (electroplating) methods, is that the sealing means sealing the process side of the wafer is not fully effective in sealing against process solution leakage. For example, the sealing means typically forms leaks between a sealing ring and the wafer process surface which allow the process solutions, for example, the electrolyte or polishing solutions to migrate through to contaminate the backside of the wafer. Such contamination adversely affects downstream processes and reduces throughput and yield.

These and other shortcomings demonstrate a need in the semiconductor processing art to develop a method for electrodeposition whereby contamination of the process wafer backside is reduced or avoided.

It is therefore an object of the invention to provide a method for electrodeposition whereby for electrodeposition whereby contamination of the process wafer backside is reduced or avoided while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for reducing or avoiding semiconductor wafer peripheral defects and contamination during and following electrode position.

In a first embodiment, the method includes providing a wafer chuck assembly sealably attached to a back side of a semiconductor wafer leaving an exposed peripheral portion of adjacent the back side of the semiconductor wafer edge the backside parallel to a front side of the semiconductor wafer comprising a process surface; contacting at least the semiconductor wafer process surface with the process solution for processing while simultaneously spinning the semiconductor wafer; and, simultaneously directing a pressurized flow of gas onto the exposed peripheral portion such that the pressurized flow of gas covers the exposed peripheral portion including being radially directed outward toward the periphery of over the semiconductor wafer edge.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

In the method and apparatus according to the present invention, the invention is explained by reference to an electrodeposition apparatus where both electrodeposition and electropolishing are carried out. It will be appreciated that the method of the present invention is applicable for carrying out the electrodeposition and electropolishing in the same or separate electrolyte baths. In addition, the method of the present invention is explained with reference to an exemplary electrodeposition apparatus although it will be appreciated that the method of the present invention is likewise applicable to any electrodeposition and polishing apparatus, including rinsing and edge and bevel removal apparatus where it would be advantageous to reduce contamination of the backside of a process wafer by a process solution to include avoiding defects at the periphery of the front side (process side) of the process wafer and reduce contamination to the back side of the process wafer by applying a purge gas to the backside of the process wafer according to one or more embodiments of the present invention.

Figure 3A:
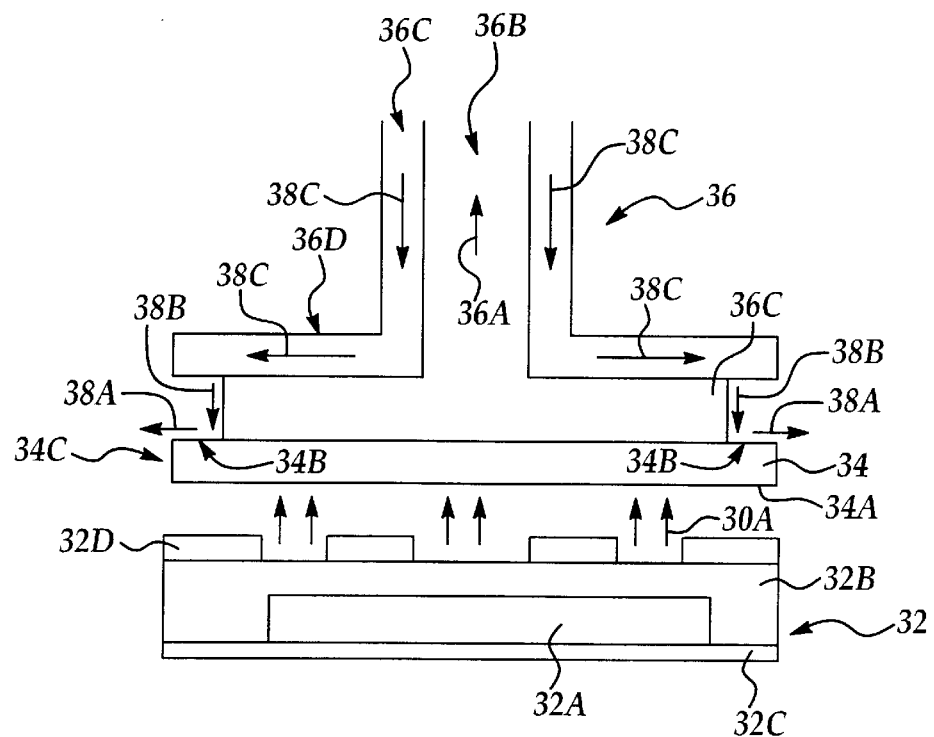
FIGS. 3A and 3B are conceptual cross sectional side view representations of an electrode assembly arrangement during an exemplary electrodeposition and electropolishing process with a purge gas arrangement according to an embodiment of the present invention.

In an exemplary apparatus for carrying out the present invention reference is made to FIG. 3A where a schematic representation (not showing the electrolyte container) shows the relationship of semiconductor wafer 34 with process surface 34A in spaced apart relation to an anode assembly 32 for carrying out an electrodeposition process. In a typical electrodeposition process the semiconductor wafer surface 34A is in spaced apart relation to the anode assembly 32. The anode assembly 32, for example, includes an anode 32A, for example, formed of copper or an alloy thereof for supplying copper ions for copper electroplating. The anode 32A is for example, surrounded by titanium top plate, 32B and a titanium bottom plate 32C. An anode pad e.g., 32D covers the titanium top plate 32B for directing an electrolytic current flow indicated by directional arrows e.g., 30A to the semiconductor wafer 34 for electroplating, for example, copper, onto the semiconductor wafer surface 34A. In operation, an electrical potential is applied between the anode assembly 32 and the semiconductor wafer 34 (cathode) by a power source (not shown) for carrying out an electrodeposition or an electropolishing process. It will be appreciated that the power source may be controlled to deliver a predetermined current density for a predetermined period of time according to a predetermined waveform by methods known in the art.

In operation, the anode assembly 32 and semiconductor wafer surface 34A are positioned so that an electrolyte carries positively charged copper ions, supplied by the anode 32A, to the negatively charged semiconductor wafer surface 34A (cathode) where the positively charged copper ions are plated out by a reducing the copper ions to copper metal whereby copper plating occurs on the semiconductor wafer surface 34A. The electrolyte solution includes, for example, copper sulfate and may be an acidic or basic solution including complexing agents as is known in the art.

Still referring to FIG. 3A, a vacuum chuck 36C holds the semiconductor wafer 34 by means of a vacuum applied to the backside of the wafer through, for example hollow shaft 36 to create a suction force as indicated by directional arrow 36A, for example through gas path 36B the suction force being maintained by a sealing means (not shown), for example, a sealing ring which is disposed at the periphery of the vacuum chuck 36C to contact the periphery of the backside of the semiconductor wafer. A portion of the semiconductor wafer back side periphery includes an exposed peripheral portion e.g., 34B. In practice, during electrodeposition the semiconductor wafer 34 may optionally be rotated while the semiconductor wafer surface 34A is immersed in electrolyte, for example, at a rate of about 10 rpm to about 200 rpm. In spinning operation, the centrifugal force of the spinning wafer drives a portion of the electrolyte contacting the backside of the process wafer radially outward toward the periphery, however, a portion of the process solution, for example, electrolyte, is drawn up and over the edge portion 34C of the semiconductor wafer 34 and flows onto and contaminates the backside of the wafer.

According to one embodiment of the present invention, a flow of purge gas is directed, preferably substantially perpendicularly as shown by gas flow directional arrow e.g., 38B, onto the exposed peripheral portion, e.g., 34B of the back side of the process wafer where it impinges on the surface to cover the exposed peripheral portion 34B and is radially directed outward along the surface to the wafer periphery as shown by purge gas directional arrows e.g., 38A. The purge gas may be applied by any means, one approach being directing the gas flow as indicated by gas flow directional arrows e.g., 38C through an outer annulus 36C of the shaft 36B to a manifold 36D overlying the exposed peripheral portion 34B of the back side of the wafer with the flow of purge gas preferably directed substantially perpendicularly onto the exposed peripheral portion 34B of the process wafer as shown by gas flow directional arrows e.g., 38B.

The flow of pressurized purge gas, preferably an inert gas, is directed onto the backside of the wafer for example, by supplying a pressurized gas flow to manifold 36D to cover the exposed peripheral portion 34B of the wafer back side. The flow is rate of purge gas is preferably sufficient to at least minimize the process solution, for example, electrolyte, from flowing onto the backside of the wafer. For example, the pressurized purge gas is preferably supplied at pressure of about 40 PSI to about 60 PSI. The pressurized purge gas is preferably continuously directed onto the exposed peripheral portion 34B of the back side of the process wafer 34 throughout the electrodeposition process.

Figure 3B:
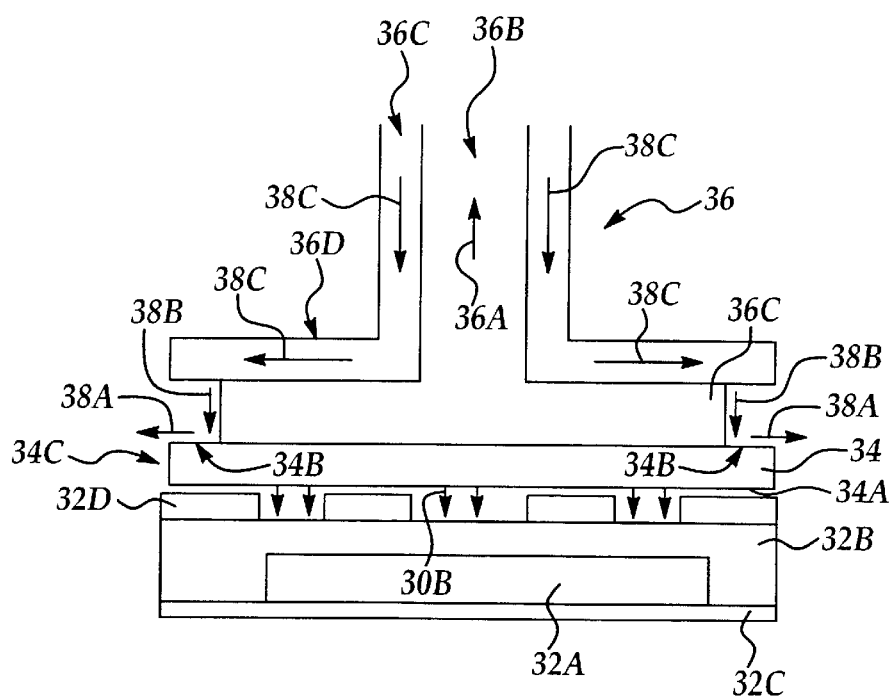

Following the electrodeposition process, the process wafer is typically subjected to an electropolishing process where the semiconductor wafer process surface contacts the anode assembly surface as shown in FIG. 3B. During this process the current flow as indicated by directional arrows e.g., 30B are reversed, the semiconductor wafer becoming the anode and the anode assembly now acting as a cathode. During the electropolishing process the electrolyte solution is readily drawn up around the wafer edge 34C to contaminate the exposed peripheral portion 34B of the wafer backside according to the prior art. In another embodiment of the present invention the flow of pressurized purge gas during this process step is preferably applied at a pressure of about 10 PSI to about 30 PSI (reduced flow rate gas purge) to impinge upon the exposed peripheral portion 34B of the backside of the wafer 34 to be radially directed outward toward the wafer periphery shown by gas flow directional arrows 38B and 38A as in the previous embodiments. The pressure of the applied pressurized purge gas is preferably sufficient to at least minimize the process solution, for example, electrolyte, from flowing onto the backside of the wafer. The pressurized purge gas is preferably continuously directed onto the exposed peripheral portion 34B of the back side of the process wafer 34 throughout the electropolishing process.

Following the electrodeposition and electropolishing steps, the semiconductor wafer is typically subjected to a rinsing step where the semiconductor wafer surface 34A is contacted by, for example, deionized water. During this process according to another embodiment of the present invention, the purge gas flow is preferably reduced from about 75 percent to about 100 percent compared the previous electrodeposition step, for example from about 0 PSI to about 15 PSI. More preferably, the purge gas flow is stopped (100 percent reduction). Applying the purge gas to the exposed peripheral portion (e.g., 34B) of the wafer back side during the rinsing process at higher pressures prevents deionized water from contacting the edge portion of the wafer process surface thereby causing wafer process surface edge defects. Following the rinsing process the semiconductor wafer is, dried for example by spinning the wafer from about 100 rpm to about 2000 rpm. During the drying process, the pressurized purge gas pressure is increased to about 40 PSI to about 60 PSI to maximize a flow rate and thereby a drying rate.

In another process, the semiconductor wafer is subjected an edge and bevel removal process to remove undesired electroplating metal at an edge portion of the semiconductor wafer as is known to those skilled in the art. During this process the purge gas flow rate is preferably reduced from about 75 percent to about 100 percent compared the previous electrodeposition step, for example about 0 PSI to about 15 PSI including being stopped. The pressurized purge gas flow is reduced or stopped during the edge and bevel removal process (EBR) to prevent the formation of an uneven etching pattern at the wafer edge caused by rippling disturbances, or eddy currents in the EBR solution induced by the gas flow.

Figure 1:
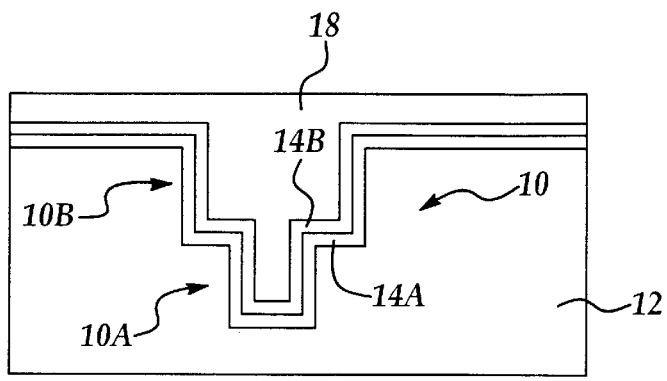
FIG. 1 is a cross sectional side view representation of a portion of a semiconductor wafer showing an anisotropically etched feature filled with metal in an exemplary electrodeposition process according to the prior art.
Figure 2:
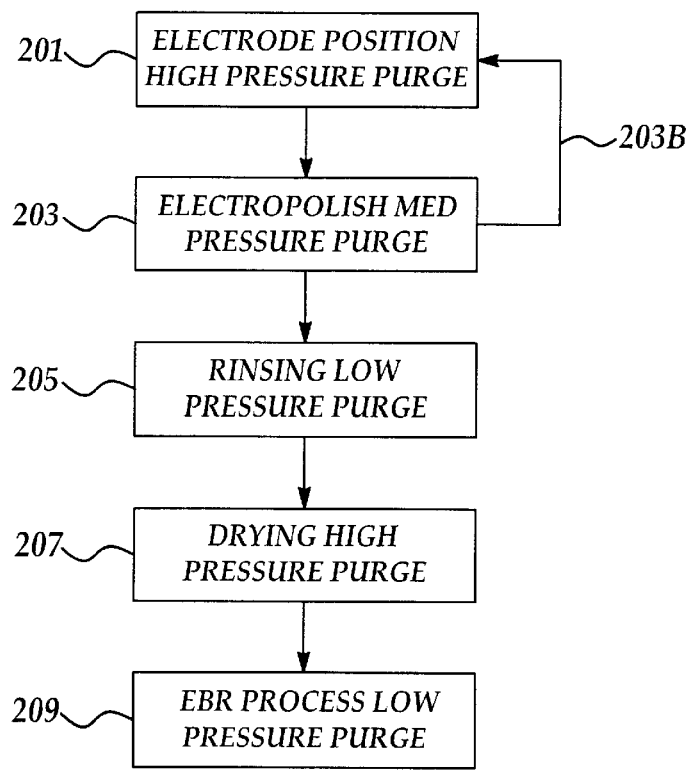
FIG. 2 is a process flow diagram encompassing several embodiments of applying a purge gas according to the present invention.

Referring to FIG. 2 is a process flow diagram showing several embodiments of the present invention as described above. In a first process 201 the semiconductor wafer is subjected to an electrodeposition process with a relatively high pressure gas purge, for example about 40 to about 60 PSI, the gas purge including directing a gas flow substantially perpendicularly to an exposed peripheral portion of the backside of the wafer and being radially directed outward toward the wafer periphery. Following the electrodeposition process the wafer is subjected to an electropolishing process 203 with a medium pressure gas purge, for example about 10 PSI to about 30 PSI. It will be appreciated that the electrodeposition and electropolishing processes may be repeatedly performed as indicated by directional process arrow 203B.

Following processes 201 and 203, the semiconductor wafer is subjected to a rinsing process 205 where a rinsing solution is applied to the front side of the wafer. In process 205 a relatively lower pressure gas purge is applied, for example form about 0 to about 15 PSI, more preferably the gas flow purge being stopped. Following process 205 the semiconductor wafer is subjected to a drying process 207 preferably including a spinning the semiconductor wafer where a relatively higher pressure gas purge, for example about 40 to about 60 PSI is applied. Following drying process 207, the semiconductor wafer is subjected to an edge and bevel removal process 209 to remove electrodeposited material from the semiconductor wafer edge portion, where as in process 205, a relatively lower pressure gas purge is applied, for example, from about 0 to about 15 PSI, more preferably the gas flow purge being stopped.

In implementing one or more of the embodiments of the method according to the present invention is has been found that semiconductor wafer process surface defects at the periphery of the process surface including microbubble formation are reduced. In addition, contamination of the back side surface of the semiconductor wafer is reduced thereby improving a semiconductor electrodeposition process during and following electrodeposition to increase a process wafer throughput and yield.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for reducing or avoiding semiconductor wafer peripheral defects and contamination during and following electrodeposition when contacting a semiconductor wafer process surface with a process solution comprising the steps of:

providing a wafer chuck assembly sealably attached to a back side of a semiconductor wafer leaving an exposed peripheral portion adjacent the back side of the semiconductor wafer edge;

contacting at least the semiconductor wafer process surface with a process solution for processing while simultaneously spinning the semiconductor wafer; and, simultaneously directing a pressurized flow of gas onto the exposed peripheral portion such that the pressurized flow of gas covers the exposed peripheral portion including being radially directed outward over the semiconductor wafer edge.

2. The method of claim 1, wherein the step contacting includes one of an electrodeposition and electropolishing solution for respectively carrying out an electrodeposition process and an electropolishing process.

3. The method of claim 2, wherein the pressurized flow of gas during an electrodeposition process is applied at a pressure of about 40 PSI to about 60 PSI.

4. The method of claim 2, wherein the pressurized flow of gas is applied at a sufficiently high pressure to prevent a process solution flow onto the exposed peripheral portion of the back side.

5. The method of claim 2, wherein the pressurized flow of gas during an electropolishing process is applied at a pressure of about 10 PSI to about 30 PSI.

6. The method of claim 1, wherein the process solution includes an etching solution for carrying out an EBR process.

7. The method of claim 6, wherein the pressurized flow of gas is applied at a pressure of about 0 PSI to about 15 PSI to avoid causing eddy currents at the semiconductor process surface edge.

8. The method of claim 1, wherein the process solution includes a rinsing solution including deionized water for carrying out a rinsing process.

9. The method of claim 8, wherein the pressurized flow of gas is applied at a pressure of about 0 PSI to about 15 PSI to allow the rinsing solution to substantially rinse the semiconductor process surface edge.

10. The method of claim 1, further comprising the step of drying the semiconductor wafer including repeating the step of simultaneously directing a pressurized flow of gas.

11. The method of claim 1, further comprising the step of drying the semiconductor wafer including repeating the step of simultaneously directing a pressurized flow of gas.

12. The method of claim 11, wherein the pressurized flow of gas is applied at a pressure of about 40 PSI to about 60 PSI to maximize a drying rate.

13. The method of claim 1, wherein the pressurized flow of gas is an inert gas including at least one of argon, helium, and nitrogen.

14. A method for reducing or avoiding semiconductor wafer peripheral defects and contamination during and following electrode position or electropolishing when contacting a spinning semiconductor wafer process surface with a process solution comprising the steps of:

subjecting a spinning semiconductor wafer process surface to at least one process comprising contact with a process solution while simultaneously applying a gas flow rate according to a purge process comprising supplying a pressurized gas flow to cover an exposed peripheral portion adjacent a backside of the semiconductor wafer edge the pressurized gas source directed such that the gas flow impinges on the exposed peripheral portion and is directed radially outward unrestrictedly over the semiconductor wafer edge.

15. The method of claim 14, wherein the purge process includes supplying the pressurized gas flow at a pressure of from about 40 PSI to about 60 PSI.

16. The method of claim 15, wherein the purge process includes supplying the pressurized gas flow at a pressure of from about 10 PSI to about 30 PSI.

17. The method of claim 16, wherein the at least one process further includes a subsequent rinsing process wherein the purge process includes supplying the pressurized gas flow at a reduced pressure including stopping the gas flow.

18. The method of claim 17, wherein the at least one process further includes a subsequent drying process wherein the purge process includes supplying the pressurized gas flow at a pressure of about 40 PSI to about 60 PSI.

19. The method of claim 18, wherein the at least one process includes a subsequent edge and bevel removal (EBR) process wherein the purge process includes supplying the pressurized gas flow at a reduced pressure including stopping the gas flow.

20. The method of claim 14, wherein the pressurized gas flow includes at least one of argon, helium, and nitrogen.

* * * * *